US006684182B1

(12) United States Patent
Gold et al.

(10) Patent No.: US 6,684,182 B1
(45) Date of Patent: Jan. 27, 2004

(54) INTEGRATED SPACECRAFT EMULATION SYSTEM AND METHOD FOR OPERATING SAME

(75) Inventors: Jeffrey J. Gold, Rancho Palos Verdes, CA (US); David L. Koza, Lakewood, CA (US); Michael J. Surace, Rancho Palos Verdes, CA (US); Steven R. Zammit, Redondo Beach, CA (US)

(73) Assignee: Hughes Electronics Corporation, Irvine, CA (US)

( * ) Notice: Subject to any disclaimer, the term of this patent is extended or adjusted under 35 U.S.C. 154(b) by 0 days.

(21) Appl. No.: 09/528,588

(22) Filed: Mar. 20, 2000

(51) Int. Cl.[7] .................................................. G06G 7/48

(52) U.S. Cl. .............................. 703/8; 703/20; 703/21; 703/23; 703/24; 703/27; 434/30; 434/34; 434/35; 434/37; 701/4; 701/13; 702/108

(58) Field of Search ................................ 703/8, 21, 20, 703/22, 23, 24, 25, 27; 434/30, 2, 35, 34, 37, 242, 241, 243; 701/220, 207, 221, 223, 4, 13, 200; 702/108, 121, 122; 714/28; 244/164, 221, 175, 176, 177

(56) References Cited

U.S. PATENT DOCUMENTS 5,017,141 A * 5/1991 Relf et al. .................... 434/29
5,260,874 A * 11/1993 Berner et al. ................. 701/33
5,428,530 A * 6/1995 Brown et al. .................. 703/8
5,435,725 A * 7/1995 Ikeuchi ........................ 434/30
5,541,863 A * 7/1996 Magor et al. ............... 702/122
5,756,891 A * 5/1998 Nakaya et al. ................ 73/147
5,808,921 A * 9/1998 Gold et al. ................. 702/108
6,020,956 A * 2/2000 Herman et al. ........ 356/139.01
6,127,970 A * 10/2000 Lin ....................... 342/357.14
6,234,799 B1 * 5/2001 Lin ............................ 434/30
6,298,318 B1 * 10/2001 Lin ............................ 703/23
6,553,328 B1 * 4/2003 Gold ......................... 702/108

OTHER PUBLICATIONS

Ptak et al, Real–Time Spacecraft Simulation and Hardware in the Loop Testing, IEEE 1998.*
Leitner, J. , Space Technology Transition using Hardware in the Loop Simulation, IEEE 1996.*
Reinholtz, K., Applying Simulation to the Development of Space Flight Software, IEEE 1999.*
Kope et al., A Tool for Teting and Simulation of Avionic and Spacecraft Systems, IEEE 1990.*
Leang et al., Real–time Testbed Spacecraft Simulation for the Deep Space One Spacecraft, IEEE 1997.*
Carlsson, Cost Effective Satellite Development with us of an Ada Microprocessor, ACM 1995.*

* cited by examiner

*Primary Examiner*—W. Thomson
(74) *Attorney, Agent, or Firm*—Terje Gudmestad

(57) ABSTRACT

A spacecraft emulation system that can emulate both the attitude control subsystem and the non-attitude control subsystem is integrated into a single compact unit. The unit includes an emulated spacecraft control processor for processing attitude control information and an emulated central command and telemetry unit for interfacing simulated spacecraft data. The inlet also includes a first simulation engine that is operative to simulate the spacecraft attitude control system and a second simulation engine that is operative to simulate the spacecraft power, thermal, propulsion and payload subsystems. Both the first and second simulation engines are connected to the emulated spacecraft control processor via a respective bus. A host computer provides the command data and receives the telemetry data from the emulated spacecraft control processor.

10 Claims, 1 Drawing Sheet

INTEGRATED SPACECRAFT EMULATION SYSTEM AND METHOD FOR OPERATING SAME

TECHNICAL FIELD

The present invention relates generally to spacecraft simulation, and more particularly to a complete spacecraft simulation system that is encapsulated and integrated within a single compact computer system.

BACKGROUND OF THE INVENTION

The increasing size and complexity of various spacecraft and associated subsystems therefore have created a need for detailed validation and verification before deployment. Examples of spacecraft related subsystems requiring validation and verification include: (i) multiprocessor-based systems which can have complex software architectures; (ii) fault detection and response systems providing extended autonomous operation; (iii) multiple-articulated payloads and multibody control; (iv) precision payload pointing systems with multiple interacting elements; and (v) sophisticated ground software for automated spacecraft operations.

However, system-level ground testing to verify full system performance of a spacecraft can be costly and/or inadequate. Present implementations of hardware-in-the-loop systems to provide ground testing require expensive engineering models, as well as, special purpose interface hardware and harnessing to create a test environment whereby hardware or emulations thereof can be integrated with a high-fidelity, non-linear, real-time simulation and then instrumented to facilitate verification and validation testimony.

One prior emulation system is disclosed in U.S. Pat. No. 5,808,921. The '921 patent is commonly assigned and has three common co-inventors with the present invention. In the '921 patent, the emulation system requires special purpose interface hardware in the form of an additional computer system to provide a complete simulation of the tangent spacecraft as the system disclosed in the '921 patent is only capable of emulating the spacecraft's attitude control subsystem. Thus, in order to emulate other sub-systems, a separate computer system is required. The simulation system disclosed in the '921 patent suffers from relatively low real-time and functional fidelity with regard to these other subsystems. This is due in part to the complex architecture and low reliability of two separate computer systems, as well as the utilization of relatively simplistic software logic.

In order to emulate other system functions, for example, the system of the '921 patent as well as other systems utilize dedicated lines connecting the system to remote computers in order to effectuate the transfer of command and telemetry data about the spacecraft bus and payload. These systems thus require additional hardware systems to effectuate all spacecraft functions, take up a relatively large amount of space, are less reliable and provide relatively low functional fidelity.

SUMMARY OF THE INVENTION

It is an object of the present invention to provide a low-cost, reliable system for verifying an embedded processor-based system which emulates the entire spacecraft bus and portions of the ground system and which requires less facility resources (e.g. test equipment) in comparison to previously-implemented hardware-in-the-loop systems.

It is a further object of the present invention to provide a system for testing an embedded processor-based system which does not require special purpose interface hardware and harnessing to integrate the embedded processor-based system with a high-fidelity, non-linear, real-time dynamic simulator.

It is still another object of the present invention to provide a system for emulating the transfer of telemetry and command data within a spacecraft that provides fidelity that will enable more realistic ground testing.

It is still a further object of the present invention to provide a test facility with greatly reduced size and cost allowing for greatly increased portability and utility.

It is yet another object of the present invention to provide a complete, very integrated, high fidelity simulation system that is provided in a single enclosure.

In accordance with the objects of the present invention, a spacecraft emulation system is provided. The system includes an emulated spacecraft control processor which contains an embedded processor that provides an emulated input/output interface to communicate simulated spacecraft data, wherein the embedded processor processes the simulated data. The system includes a first simulation engine which processes the attitude control system command data from the emulated spacecraft control processor to simulate the attitude control system (ACS) of the spacecraft in real-time. The first simulation engine is operative to produce the simulated attitude sensor data for input to the emulated spacecraft control processor based on the simulated system dynamics. The system also includes a second simulation engine which processes the non-ACS subsystems of the spacecraft in real-time, specifically, thermal, power propulsion and payload subsystems. The second simulation engine is operative to produce the simulated non-ACS telemetry data for input to the emulated spacecraft control processor and/or ground segment based on the simulated system dynamics. The second simulation engine is in communication with the embedded processor through a VMEbus connection. Additionally, the system includes an emulated central telemetry and command unit (ECTCU) which processes and distributes telemetry and command data. The system includes an interface manager which provides a conduit for command and telemetry data transferred between the ground control system and the ECTCU.

These and other features, aspects, and embodiments of the present invention will become better understood when viewed in connection with the following description, appended claims, and accompanying drawings.

BEST MODE(S) FOR CARRYING OUT THE INVENTION

Figure 1:
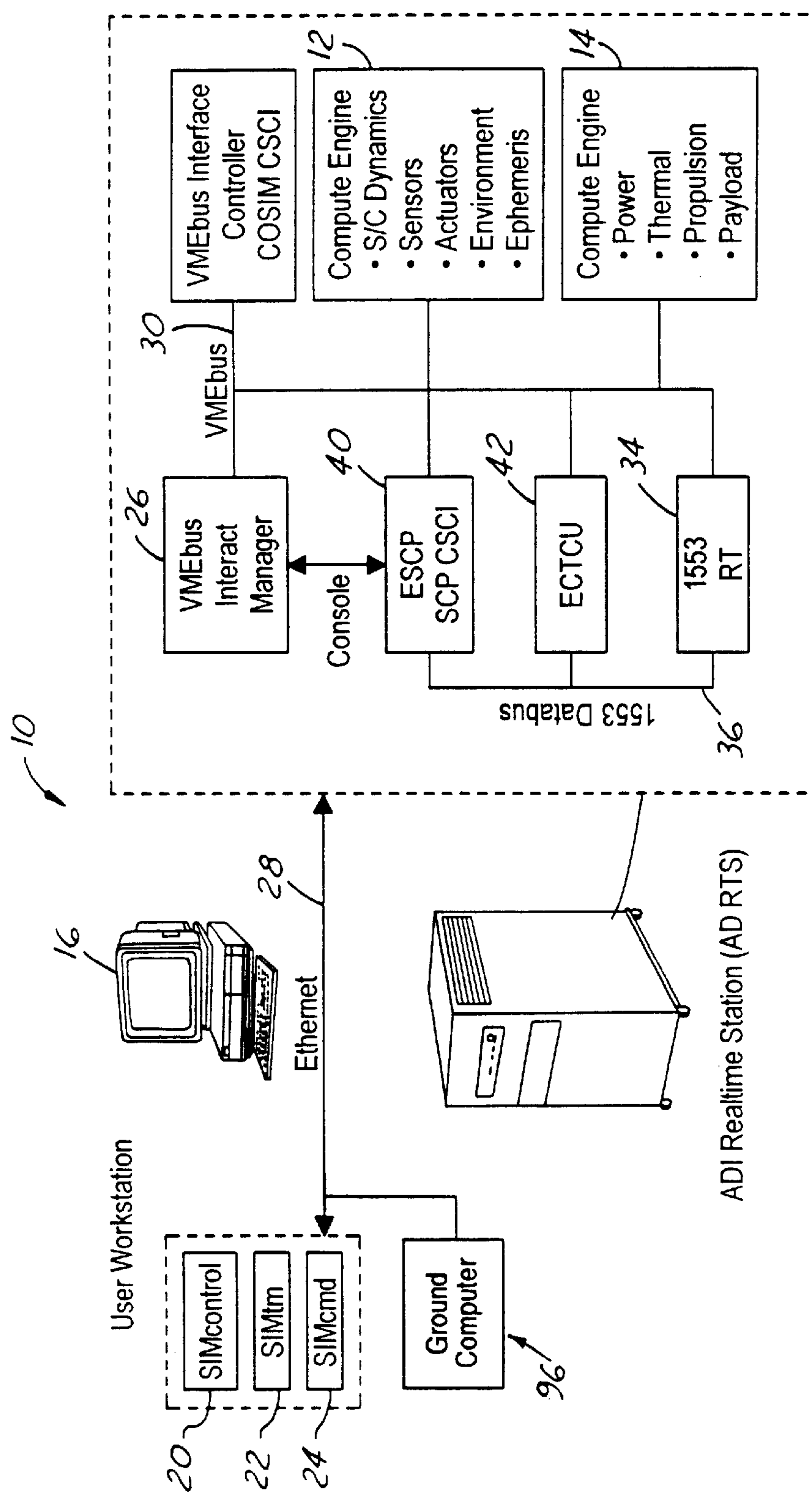
FIG. 1 is a block diagram of an embodiment of a real-time spacecraft simulation system in accordance with a preferred embodiment of the present invention.

FIG. 1 is a block diagram of a real-time spacecraft simulation system 10 in accordance with the present invention. The real-time spacecraft simulation system 10 can be embodied by an Applied Dynamics Real Time Station (AD RTS) manufactured by Applied Dynamics. The AD RTS system is a stand-alone VMEbus-based real-time simulation and analysis system which uses a mixture of 9U×400 mm ADI commercially available processor and input/output cards. Physically, the AD RTS system can be contained in a mini-tower housing.

The real-time spacecraft simulation system 10 includes a plurality of simulation engines (SE) which are generally designated by reference numbers 12, 14 which are used to simulate system dynamics in real time. For an AD RTS system, the simulation engines 12, 14 are preferably in the form of processor cards which are installed in the mini-tower.

Each simulation engine 12, 14 is a processor that solves the dynamic equations of motion, power or heat transfer in real-time. One or more simulation engines can be installed in the real-time spacecraft simulation system as problem size and complexity increase throughput requirements. In the preferred embodiment, the first simulation engine 12 hosts the simulation software that allows it to be used to model the dynamics associated with the attitude control subsystem (ACS) of the spacecraft. The ACS simulation engine 12 models spacecraft dynamics, sensors and actuators, along with environmental and orbital conditions. The simulation engine 12 may, for example, be implemented in a MVME2604 single board computer (SBC) operating at 330 MHz. However, the engine may be embodied in a variety of other forms.

In the preferred embodiment, the simulation engine 14 hosts the simulation software that allows it to be used to model non-ACS spacecraft subsystems, such as power, thermal, propulsion, and payload (power and thermal characteristics). In a preferred embodiment, the simulation engine is implemented in a MVME2604 SBC. However, the simulation engine may be embodied in a variety of other forms. The simulation modules 12, 14 are also preferably implemented in an ADI proprietary simulation language such as ADSIM.

A host computer 16 with an interface 18 is utilized for simulation development, cross-compiling, interfacing to a user, and displaying output information. The host computer 16 can be embodied by a computer workstation such as ones available from Sun, Hewlett-Packard, or VAX, for example. The host computer 16 runs simulation system software having interactive commands which provide simulation control and status. The simulation system software can be embodied by ADI Simsystem software. The simulation system software preferably includes a SIMcontrol module 20 for controlling the simulation, a SIMtm module 22 for displaying telemetry data, and a SIMcmd 24 module for generating spacecraft commands. The host computer 16 also utilizes a real-time plotting software package to provide strip chart and x-y plot capabilities. Such a real-time plotting package can be embodied by the Simplot software package. The interface 18 provides the proper protocol to communicate with AD RTS.

The host computer 16 through interface 18 communicates with a VMEbus interactive manager (VIM) 26 through an Ethernet line or other communication line 28. The VIM 26 is operative to initialize the real-time spacecraft simulation system 10, download application software to the embedded processors in the real-time spacecraft simulation system 10, and monitor simulation parameters in real time. An additional feature of the VIM 26 is to provide bi-directional data transfer between the processors in the real-time spacecraft simulation system 10 and the host computer 16 via a VMEbus 30; spacecraft telemetry data in one direction and spacecraft command data in the other direction. In a preferred embodiment, VIM 16 is constructed of a Motorola MVME2603 SBC containing the servers which interact via TCP/IP protocols with the workstation resident, software telemetry and command applications. The VIM 26 also contains software which supports the SIMsystem operating system.

The VIM 26 through the VMEbus 30 communicates telemetry and command data to the ECTCU 42 via the second simulation engine 14 which may contain interfacing software logic. THE ECTCU 42 which is the 1553 databus 36 bus controller, is a functional equivalent of the Central Telemetry and Command Unit (CTCU) bus controller element of the spacecraft. It contains non-flight versions of the CTCU flight components along with a customized version of the PROM sequencer firmware.

Alternative embodiments of the ECTCU 42 include circuitry to support hardwired interfaces that bypass the VMEbus 30 and VIM 26 and allow ground based baseband equipment (e.g. command generators and telemetry frame synchronizers) to be directly linked to the ECTCU for the purpose of enhanced ground segment testing.

The ESCP 40 of the AD RTS system is a VMEbus-compatible card that emulates a Spacecraft Control Processor (SCP). The ESCP 40 includes a microprocessor along with supporting circuitry to execute flight software. The ESCP 40 and the simulation engines 12, 14 are accessed to perform data transfers, and to provide/receive data to/from the VIM 26 for real-time data logging and user control. A plurality of ESCPs can be included to reflect the redundancy of operational systems.

Alternative embodiments of the ESCP 40 include circuitry to support interfaces that cannot be implemented with the VMEbus 30 or the 1553 databus 36, such as a very fast interface or an analog interface.

The 1553 RT card 34 is used to imitate the various MIL STD 1553 remote terminals (RT) used on a 1553 databus 36 that correspond to MIL STD 1553 RTs on the spacecraft. Specifically, the 1553 RT card 34 imitates the hardware interface of a respective bus and payload Remote Telemetry and Command Units (RTCUs), as well as, the Hemispherical Inertial Reference Unit. The 1553 RT card 34 is preferably a commercial card from SBS. The software logic controlling the 1553 RT card 34 may physically reside in the second simulation engine 14 and may be implemented in C or COSIM, which is another proprietary language from ADI. The 1553 RT card 34 is preferably coupled to the 1553 databus 36, an ECTCU bus controller 38, and an ESCP 40.

The VMEbus 30 is utilized for all command, telemetry, sensor and actuator data transfer. Actuator data is communicated from the ESCP 40 to the simulation engine 12 via the VMEbus 30. Sensor data is communicated from the simulation engine 12 to the ESCP 40 via the VMEbus 30. Telemetry data is communicated from the ESCP 40 to the host computer 16 and a ground computer 96 via the VIM 26 and the VMEbus 30. Command data is communicated from the host computer 16 and/or ground computer 96 to the ESCP 40 via the VMEbus 30 and the VIM 26.

The 1553 databus 36 is utilized for all command, telemetry, power, thermal, propulsion, payload and bus interfacing; mirroring the MIL STD 1553 traffic on the target spacecraft. Power, thermal, and propulsion data is communicated from the ESCP 40 to the simulation engine 14 via the 1553 databus 36. Payload and bus data is communicated from the simulation engine 14 to the ESCP 40 and ECTCU 38 via the 1553 databus 36. SCP telemetry data is communicated from the ESCP 40 to the host computer 16 via the 1553 card 34 and the 1553 databus 36. Command data is communicated from the host computer 16 or ground computer 96 to the ESCP 40 or 1553 card 34 via the 1553 databus 36 and the ECTCU card 42.

The 1553 databus 36 adds additional capability to the system by allowing the functions of the various remote terminals contained on a spacecraft to be mimicked with tremendous fidelity and reliability and at far less expense. The resultant system 10 of the present invention has all simulation elements in a single box which is smaller, less expensive and provides more accurate simulation.

Accordingly, the bus controller on the 1553 RT card 34 allows various other elements such as remote controllers to know when they can put information onto the Local area network ("LAN") created by the 1553 databus 36. One example of a remote terminal includes a remote bus terminal that allows for commands to be transmitted from the host computer 16 or ground computer to the bus elements (e.g. actuators, heaters, etc.). Another example of a second remote terminal is a remote payload terminal that allows for telemetry information to be transmitted from the payload to the host computer 16 or ground computer 96. This provides an additional control loop between the spacecraft and the ground which is in addition to the autonomous control loop within the spacecraft. In sequence, command information is transmitted from the ground up to the spacecraft and then to the bus controller before being transmitted to one of several remote terminals.

The disclosed system 10 embodies the union of unique hardware and software algorithms for the purpose of emulating the transfer of telemetry and command data within a spacecraft which allows for the capability of executing the embedded controller terminal logic within the emulated telemetry and command hardware. The integrated software and hardware algorithms of the present system 10 simulate the attitude control, power, thermal, propulsion, payload, and telemetry/command subsystems of a spacecraft which allow for an entire spacecraft simulation system to be encapsulated and integrated within a single compact computer system. This provides greatly increased portability and utility.

In accordance with the present invention, the logic contained within the second simulation engine 14, to properly transfer and connect telemetered data, as well as to properly route command data, utilizes an automated code generator which operates on information embedded within a spacecraft engineering database. The functions of the system are positioned to accommodate throughput limitations of the embedded processors and the VMEbus 30 in order to maintain real-time fidelity of simulation.

While the best mode for carrying out the invention has been described in detail, those familiar with the art to which this invention relates will recognize various alternative designs and embodiments for practicing the invention as defined by the following claims.

What is claimed is:

1. A spacecraft emulation system comprising:

an emulated spacecraft control processor which contains an embedded processor that provides an emulated input/output interface to communicate simulated spacecraft data, wherein the embedded processor processes the simulated spacecraft data;

a first simulation engine which processes attitude control system data from the emulated spacecraft control processor to simulate an attitude control system of the spacecraft in real-time, the first simulation engine operative to produce sensor data for input to the emulated spacecraft control processor based on the simulated system dynamics;

a second simulation engine which processes non-attitude control system data from the emulated spacecraft control processor or ground status and control system to simulate non-attitude control system of the spacecraft in real-time, the second simulation engine operative to produce data from the simulated non-attitude control system for input to the emulated spacecraft control processor or ground status and control system based on the simulated system dynamics;

a databus communicating said second simulation engine with said emulated spacecraft control processor in order to transfer non-attitude control system command and telemetry information;

an emulated central telemetry and command unit which contains databus routing logic and which functions as a bus controller to control and regulate the transfer of data between spacecraft remote terminals and the ground status and control system; and a host computer which provides the command data and receives the telemetry data from the emulated spacecraft control processor.

2. The system of claim 1, wherein the attitude control system data is communicated via a VMEbus.

3. The system of claim 2, further comprising a VMEbus interface manager which communicates the command data and the telemetry data between the VMEbus and the host computer.

4. The system of claim 1, wherein the first simulation engine and the emulated spacecraft control processor are housed in a single housing.

5. The system of claim 6, wherein the non-attitude control system data is communicated via the databus.

6. A spacecraft simulation system housed in a single housing comprising:

an emulated spacecraft control processor which contains an embedded processor that provides an emulated input/output interface to communicate simulated spacecraft data, wherein the embedded processor processes the simulated spacecraft data;

a first simulation engine which processes attitude control system data from the emulated spacecraft control processor to simulate an attitude control system of the spacecraft in real-time, the first simulation engine operative to produce data from the simulated attitude control system for input to the emulated spacecraft control processor based on the simulated system dynamics;

a VMEbus which communicates the attitude control system data from the emulated spacecraft control processor;

a second simulation engine which processes power, thermal, propulsion and payload subsystem data from the emulated spacecraft control processor or ground computer to simulate power, thermal, propulsion and payload subsystems of the spacecraft in real-time, the second simulation engine operative to produce data from the power, thermal, propulsion and payload subsystems for input to the emulated spacecraft control processor or ground computer based on the simulated system dynamics;

a databus communicating spacecraft system data from simulated spacecraft bus and payload subsystems to ground status and control systems or communicating spacecraft system data to simulated spacecraft bus and payload subsystems from ground status and control systems; and a host computer which provides the command data and receives the telemetry data from the emulated spacecraft control processor.

7. The system of claim 6, further comprising a VMEbus interface manager which communicates the command data and the telemetry data between the VMEbus and the host computer or ground computer by imitating ground system baseband unit(s).

8. The system of claim 5, wherein the power, thermal, propulsion and payload subsystem data includes simulated thermal command data, power command, propulsion command data, and payload command data.

9. The system of claim 6, further comprising a 1553 RT card which communicates the command data and the telemetry data between the databus and the simulation engine.

10. The system of claim 9, wherein the 1553 RT card is configured to initiate the hardware interface of a spacecraft bus terminal and a spacecraft payload terminal and hemispherical inertial reference unit.

* * * * *